United States Patent
Zuo et al.

(10) Patent No.: US 10,070,218 B2
(45) Date of Patent: Sep. 4, 2018

(54) CLASS D AMPLIFIER CHIP WITH DUTY RATIO LIMITING FUNCTIONS AND THE DEVICE THEREOF

(71) Applicant: SHENZHEN SKYWORTH-RGB ELECTRONIC CO., LTD, Shenzhen (CN)

(72) Inventors: Shijun Zuo, Shenzhen (CN); Zhichang Yang, Shenzhen (CN); Bingjie Wu, Shenzhen (CN)

(73) Assignee: SHENZHEN SKYWORTH-RGB ELECTRONIC CO., LTD., Shenzhen (CN)

( * ) Notice: Subject to any disclaimer, the term of this patent is extended or adjusted under 35 U.S.C. 154(b) by 0 days.

(21) Appl. No.: 14/618,813

(22) PCT Filed: Sep. 22, 2014

(86) PCT No.: PCT/CN2014/087028
§ 371 (c)(1),
(2) Date: Feb. 10, 2015

(87) PCT Pub. No.: WO2015/143852
PCT Pub. Date: Oct. 1, 2015

(65) Prior Publication Data
US 2017/0013358 A1    Jan. 12, 2017

(30) Foreign Application Priority Data

Mar. 28, 2014   (CN) .......................... 2014 1 0121747

(51) Int. Cl.
*H03F 3/38*      (2006.01)
*H03F 3/217*     (2006.01)
(Continued)

(52) U.S. Cl.
CPC ............. *H04R 3/007* (2013.01); *H03F 3/185* (2013.01); *H03F 3/217* (2013.01); *H03F 3/2173* (2013.01);
(Continued)

(58) Field of Classification Search
CPC ....................................................... H03F 3/185
(Continued)

(56) References Cited

U.S. PATENT DOCUMENTS

5,389,829 A    2/1995   Milazzo
6,016,075 A    1/2000   Hamo
(Continued)

*Primary Examiner* — Khanh V Nguyen
*Assistant Examiner* — Kheim Nguyen
(74) *Attorney, Agent, or Firm* — Anova Law Group, PLLC (57) ABSTRACT

The present invention discloses a class D amplifier chip with duty ratio limiting functions and the device thereof, a class D amplifier chip includes triangle wave modules, PWM modulation modules, duty ratio detection modules and logic control modules, the input differential audio signals and triangle wave signals generated by the triangle wave module are converted into low voltage pulsed PWM signals through the PWM modulation module, then gets driving processed and generates high voltage pulses; the duty ratio detection module real-time detects the duty ratio of PWM signals, when the logic control module decides the duty ratio of the PWM signals is larger than the preset maximum value, the PWM module is controlled to stop working, equals to close the audio output of the class D amplifier device; which limits the amplitude of the output audio signals, avoids burning the speaker due to an overlarge amplitude.

12 Claims, 4 Drawing Sheets

(51) Int. Cl.
*H04R 3/00* (2006.01)
*H03K 7/08* (2006.01)
*H03F 3/185* (2006.01)

(52) U.S. Cl.
CPC ........... *H03K 7/08* (2013.01); *H03F 2200/03* (2013.01); *H03F 2200/171* (2013.01); *H03F 2200/351* (2013.01); *H03F 2200/426* (2013.01); *H03F 2200/78* (2013.01)

(58) Field of Classification Search
USPC ........................................ 330/10, 251, 207 A
See application file for complete search history.

(56) References Cited

U.S. PATENT DOCUMENTS

| | | | | |
|---|---|---|---|---|
| 7,142,050 B2* | 11/2006 | Risbo | ...................... | H03F 3/217 330/10 |
| 2004/0036529 A1 | 2/2004 | Tsuji | | |
| 2007/0268069 A1 | 11/2007 | Kang | | |
| 2008/0030267 A1* | 2/2008 | Yang | ........................ | H03F 1/26 330/10 |

* cited by examiner

Fig. 1
Illustration of a prior art class D amplifier

CLASS D AMPLIFIER CHIP WITH DUTY RATIO LIMITING FUNCTIONS AND THE DEVICE THEREOF

FIELD OF THE INVENTION

The present invention relates to the field of technologies on power supplies, and more particularly, to a class D amplifier chip with duty ratio limiting functions and the device thereof.

CROSS-REFERENCES TO RELATED APPLICATIONS

This application claims the priority of PCT patent application no. PCT/CN2014/087028 filed on Sep. 24, 2014 and Chinese patent application no. 201410121747.2 filed on Mar. 28, 2014 the entire contents of all of which are incorporated herein by reference.

BACKGROUND

Figure 1:
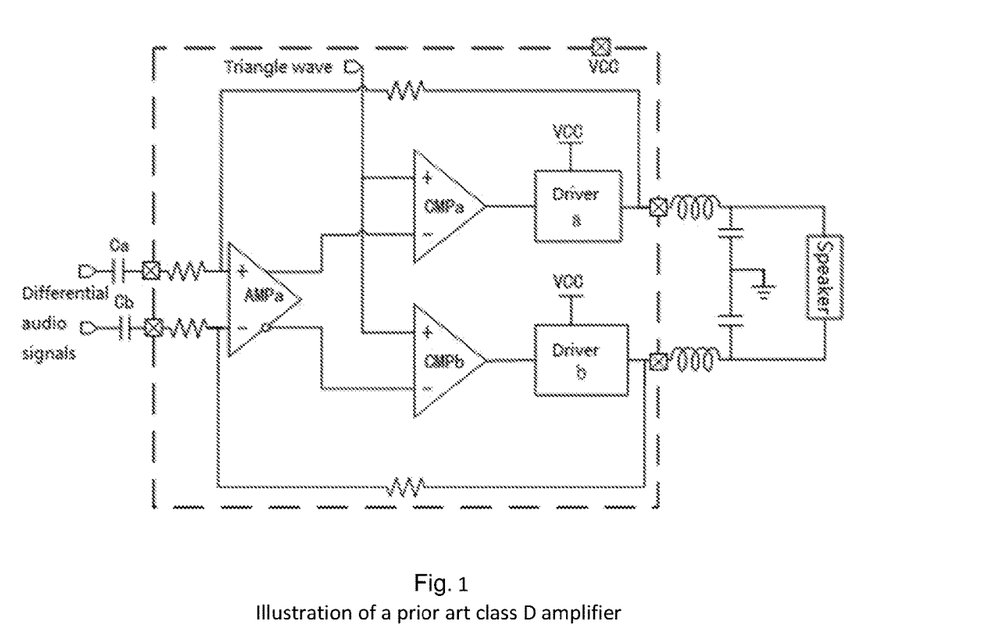
FIG. 1 illustrates a circuit diagram of the application of current class D amplifiers in prior arts.

Class D amplifier (i.e., class D audio power amplifier) is a switching type power amplifier, which has the advantage of high efficiency and less heat generating, it has been widely applied to the field of consumer electronic products area, including intelligent TVs, intelligent cell phones and more. Referring to FIG. 1, commonly seen class D amplifiers (Inside the dashed box in FIG. 1, it is the internal structure of a class D amplifier,) include: Amplifier a (AMPa), Comparator a (CMPa), Comparator b (CMPb), Driver a and Driver b; their connection relationship is shown in FIG. 1. The operating principle of this class D amplifier is based on PWM (Pulse Width Modulation) mode: differential audio signals are amplified by the amplifier AMPa, then input into the comparators CMPa and CMPb in two routes separately, after comparing with the input triangle wave signals, two routes of PWM signals are achieved respectively, then the amplitudes of the two routes of PWM signals are amplified when passing through the driver a and driver b separately; finally, they are filtered and restored into audio signals, which drive the speaker to vibrate and give out voices.

When the amplitude of the input differential audio signals is overlarge, it could make the amplitude of the restored audio signals exceed the power rating of the speaker, or cause short circuit to the capacitor for input, Ca or Cb, resulting in making the restored audio signals a DC component, which could burn the speaker out. In order to avoid this kind of anomalies happen, the output amplitude of the class D amplifier needs to be restricted. Since the pulse width of the PWM signals, (i.e., the duty ratio) is proportional to the audio signal amplitude, therefore, it is possible to restrict the amplitude of the audio signals for output by limiting the duty ratio of the PWM signals.

BRIEF SUMMARY OF THE DISCLOSURE

The technical problem to be solved in the present invention, aiming at the defects of the prior art, provides a class D amplifier chip with duty ratio limiting functions and the device thereof, in order to solve the problem in the prior art, that is, the class D amplifiers in the prior art are not able to restrict the output amplitude of audio signals, and, when the duty ratio of the PWM signals is overlarge, the speaker could get burnt out.

The technical solution of the present invention to solve the said technical problems is as follows: a class D amplifier chip with duty ratio limiting functions, wherein, comprising a triangle wave module, configured to generate triangle wave signals; a PWM modulation module, configured to convert the input differential audio signals and the triangle wave signals generated by the said triangle wave module into low voltage pulsed PWM signals, drive the said PWM signals and generate high voltage pulses; a duty ratio detection module, configured to real-time detect the duty ratio of the PWM signals generated by the said PWM modulation module; a logic control module, configured to control the PWM modulation module stop working while deciding the duty ratio of the PWM signals is larger than the preset maximum value.

The said class D amplifier chip with duty ratio limiting functions, wherein, the said PWM modulation module comprises a first resistor, a second resistor, a third resistor, a fourth resistor, a first amplifier, a first comparator, a second comparator, a first driving circuit and a second driving circuit; the positive input node of the said first amplifier connects to the first input node for differential audio signals through the first resistor, it also connects to the output node of the first driving circuit through the third resistor, and the inverse input node of the first amplifier connects to the second input node for the differential audio signals through the second resistor, as well as the output node of the second driving circuit through the fourth resistor, the positive output node of the first amplifier connects to the inverse input node of the first comparator, the negative output node of the first amplifier connects to the inverse input node of the second comparator, the positive input nodes of both the said first comparator and the second comparator connect to the output node of the triangle wave module, the output node of the first comparator connects to the input node of the first driving circuit and the duty ratio detection module, the output node of the second comparator connects to the input node of the second driving circuit and the duty ratio detection module, both output nodes of the first driving circuit and the second driving circuit are output node of the class D amplifier, both control nodes of the first driving circuit and the second driving circuit connect to the logic control module.

The said class D amplifier chip with duty ratio limiting functions, wherein, the said duty ratio detection module comprises: a mirror current unit, configured to convert the input bias current into charging current and discharging current following the preset ratio, then send to the charging-discharging control unit; a charging-discharging control unit, configured to output charging-discharging commands, according to the PWM signals generated by the said PWM modulation module, convert the charging and discharging currents output from the said mirror current unit into the according capacitor voltages before sending to the logic control module.

The said class D amplifier chip with duty ratio limiting functions, wherein, the said mirror current unit comprises: a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor; the gate electrode of the said first MOS transistor connects to the drain electrode of the first MOS transistor, the gate electrode of the third MOS transistor, the gate electrode of the fifth MOS transistor, and the gate electrode of the seventh MOS transistor, the source electrode of the first MOS transistor connects to the drain electrode of the second MOS transistor, the gate electrode of the second MOS transistor, the gate electrode of the fourth MOS transistor, the gate electrode of the sixth MOS transistor, the gate electrode of the eighth MOS transistor, the source electrode of the third MOS transistor connects to the drain electrode of the fourth MOS transistor, the source electrode of the fifth MOS transistor connects to the drain electrode of the sixth MOS transistor, the source electrode of the seventh MOS transistor connects to the drain electrode of the eighth MOS transistor, while the source electrodes of all the said second, fourth, sixth, eighth MOS transistors are getting grounded; the drain electrode of the said third MOS transistor connects to the drain electrode of the tenth MOS transistor, the gate electrode of the tenth MOS transistor, the gate electrode of the twelfth MOS transistor and the gate electrode of the fourteenth MOS transistor, the source electrode of the said tenth MOS transistor connects to the drain electrode of the ninth MOS transistor, the gate electrode of the ninth electrode, the gate electrode of the eleventh MOS transistor and the gate electrode of the thirteenth MOS transistor, the source electrode of the twelfth MOS transistor connects to the drain electrode of the eleventh MOS transistor, the source electrode of the fourteenth MOS transistor connects to the drain electrode of the thirteenth MOS transistor, the source electrodes of the said ninth, eleventh and thirteenth MOS transistors connect to the voltage reference node, the drain electrode of the said twelfth MOS transistor connects to the first input node of the charging-discharging control unit, the drain electrode of the said fourteenth MOS transistor connects to the second input node of the charging-discharging control unit, the drain electrode of the said fifth MOS transistor connects to the first output node of the charging-discharging control unit, the drain electrode of the said seventh MOS transistor connects to the second output node of the charging-discharging control unit.

The said class D amplifier chip with duty ratio limiting functions, wherein, the said first MOS transistor, second MOS transistor, third MOS transistor, fourth MOS transistor, fifth MOS transistor, sixth MOS transistor, seventh MOS transistor, eighth MOS transistor, are all NMOS type transistors; the said ninth MOS transistor, tenth MOS transistor, eleventh MOS transistor, twelfth MOS transistor, thirteenth MOS transistor and fourteenth MOS transistor are all PMOS type transistors.

The said class D amplifier chip with duty ratio limiting functions, wherein, the charging-discharging control unit comprises: a first inverter, a second inverter, a first capacitor, a second capacitor, a fifteenth MOS transistor, a sixteenth MOS transistor, a seventeenth MOS transistor, an eighteenth MOS transistor; the input node of the said first inverter connects to the PWM modulation module, the output node of the first inverter connects to the gate electrodes of the fifteenth and sixteenth MOS transistors, the source electrode of the fifteenth MOS transistor connects to the drain electrode of the twelfth MOS transistor, the source electrode of the sixteenth MOS transistor connects to the drain electrode of the fifth MOS transistor, one end of the said first capacitor connects to the drain electrodes of the fifteenth and sixteenth MOS transistors, while the other end of the first capacitor gets grounded; the input node of the said second inverter connects to the PWM modulation module, the output node of the second inverter connects to the gate electrodes of the seventeenth and eighteenth MOS transistors, the source electrode of the seventeenth MOS transistor connects to the drain electrode of the fourteenth MOS transistor, the source electrode of the eighteenth MOS transistor connects to the drain electrode of the seventh MOS transistor, one end of the said second capacitor connects to the drain electrodes of the seventeenth and eighteenth MOS transistors, while the other end of the second capacitor gets grounded.

The said class D amplifier chip with duty ratio limiting functions, wherein, the said logic control module comprises: a first anti-jamming circuit, a second anti-jamming circuit, a third inverter, a fourth inverter, an OR gate, a nineteenth MOS transistor, a twentieth MOS transistor, a twenty-first MOS transistor and a twenty-second MOS transistor; the gate electrode of the said nineteenth MOS transistor connects to the gate electrode of the twentieth MOS transistor and the charging-discharging control unit, the drain electrode of the nineteenth MOS transistor connects to the drain electrode of the twentieth MOS transistor and the input node of the third inverter, the source electrode of the twentieth MOS transistor connects to the input node of the first anti-jamming circuit, the output node of the said third inverter connects to the control node of the first anti-jamming circuit and the first input node of the OR gate OR; the gate electrode of the said twenty-first MOS transistor connects to the gate electrode of the twenty-second MOS transistor and the charging-discharging control unit, the drain electrode of the twenty-first MOS transistor connects to the drain electrode of the twenty-second MOS transistor and the input node of the fourth inverter, the source electrode of the twenty-second MOS transistor connects to the input node of the second anti-jamming circuit, the output node of the said fourth inverter connects to the control node of the second anti-jamming circuit and the second input node of the OR gate; the source electrodes of the said nineteenth and twenty-first MOS transistors connect to the voltage reference node, the output node of the said OR gate connects to the PWM modulation module.

The said class D amplifier chip with duty ratio limiting functions, wherein, the said first anti-jamming circuit comprises: a twenty-third MOS transistor and a twenty-fourth MOS transistor, the drain electrode of the said twenty-third MOS transistor connects to the gate electrode of the twenty-third MOS transistor, the source electrode of the twentieth MOS transistor and the drain electrode of the twenty-fourth MOS transistor, the gate electrode of the said twenty-fourth MOS transistor connects to the output node of the third inverter, the source electrodes of the said twenty-third and twenty-fourth MOS transistors are both getting grounded.

The said class D amplifier chip with duty ratio limiting functions, wherein, the said second anti-jamming circuit comprises: a twenty-fifth MOS transistor and a twenty-sixth MOS transistor, the drain electrode of the said twenty-fifth MOS transistor connects to the gate electrode of the twenty-fifth MOS transistor, the source electrode of the twenty-second MOS transistor and the drain electrode of the twenty-sixth MOS transistor, the gate electrode of the said twenty-sixth MOS transistor connects to the output node of the fourth inverter, the source electrodes of the said twenty-fifth and twenty-sixth MOS transistors are both getting grounded.

A class D amplifier device with duty ratio limiting functions, wherein, comprising: a filter, a speaker and the said class D amplifier chip with duty ratio limiting functions, the said class D amplifier chip connects to the speaker through the filter, high voltage pulses output from the class D amplifier chip are restored into audio signals after being filtered by the filter, then output to the speaker, drive the speaker vibrate and give out voices.

Comparing to the prior technologies, the class D amplifier chip with duty ratio limiting functions and the device thereof, provided in the present invention, converts the input differential audio signals and the triangle wave signals generated from the triangle wave module into low voltage pulsed PWM signals, through the PWM modulation module, and drive the said PWM signals then generates high voltage pulses; the present invention real-time detects the duty ratio of the said PWM signals, through the duty ratio detection module, when the logic control module decides the duty ratio of the PWM signals is larger than the preset maximum duty ratio, it will control the PWM modulation module stop working, shut down the output of high voltage pulses from the class D amplifier chip, that equals to turn off the audio output from the class D amplifier device; it restricts the amplitude of the output audio signals, avoids burning the speaker out due to an overlarge amplitude of the audio signals, achieves the functions of limiting audio signals and protecting the speaker.

DETAILED DESCRIPTION

The present invention provides a class D amplifier chip with duty ratio limiting functions and the device thereof, in order to make the purpose, technical solution and the advantages of the present invention clearer and more explicit, further detailed descriptions of the present invention are stated here, referencing to the attached drawings and some embodiments of the present invention. It should be understood that the detailed embodiments of the invention described here are used to explain the present invention only, instead of limiting the present invention.

Aiming at the problem in the prior art that a speaker could be burnt out when the duty ratio of PWM signals in a class D amplifier is overlarge, the present invention provides a class D amplifier with duty ratio limiting functions, which is able to shut down the output of high voltage pulses when the duty ratio of PWM signals is larger than the preset maximum duty ratio, through limiting the maximum duty ratio of PWM signals, that equals to shut down the audio output from the class D amplifier device, avoids that the output amplitude of the audio signals is overlarge and burns the speaker out; when the duty ratio of PWM signals is smaller than the preset maximum duty ratio, the high voltage pulses output from the class D amplifier chip will be turned on or kept, which ensures the class D amplifier work normally.

Figure 2:
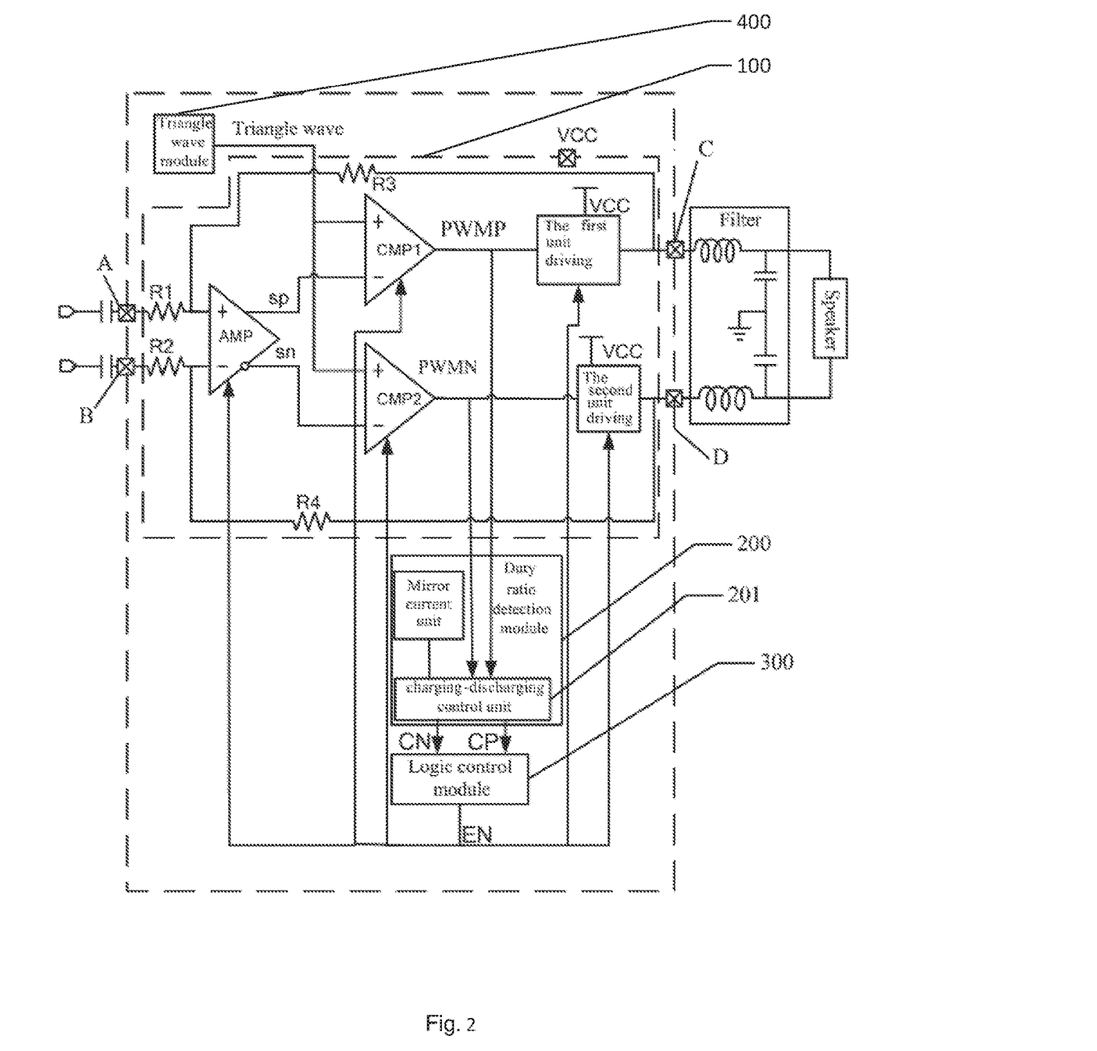
FIG. 2 illustrates a schematic diagram of the class D amplifier with duty ratio limiting functions according to an embodiment of the present invention.

Referring to FIG. 2, the class D amplifier device with duty ratio limiting functions as provided in the present invention, includes: a filter, a speaker and a class D amplifier chip 10 with duty ratio limiting functions, the said class D amplifier chip 10 connects to the speaker through the filter. The class D amplifier chip 10 includes a PWM modulation module 100, a duty ratio detection module 200, a logic control module 300 and a triangle wave module 400. The said PWM modulation module 100, duty ratio detection module 200 and logic control module 300 are connecting one by one, the said triangle wave module 400 connects to the PWM modulation module 100, and the said logic control module 300 connects to the PWM modulation module 100. The PWM modulation module 100 converts the input differential audio signals and the triangle wave signals generated by the said triangle wave module into low voltage pulsed PWM signals, and drive the said PWM signals to generate high voltage pulses, followed by filtered through the filter and restored to audio signals then output to the speaker, drives the speaker vibrating and giving out voices. When the PWM modulation module 100 is working, the duty ratio detection module 200 real-time detects the duty ratio of the said PWM signals. When the logic control module 300 decides the duty ratio of the PWM signals is larger than the preset maximum duty ratio, it controls the PWM modulation module 100 stop working, and shuts down the high voltage pulses output from the class D amplifier chip, which equals to turn off the audio output from the said class D amplifier device, and avoid burning the speaker out due to an overlarge amplitude of the audio signals output; when the duty ratio of PWM signals is smaller than the preset maximum duty ratio, the logic control module 300 will not get started, thus the PWM modulation module 100 works normally, ensures the audio signals output normally. Wherein, the said triangle wave module 400 belongs to the current technology, thus it will not be described here in details.

It should be understood that, the said differential audio signals input into the PWM modulation module 100 in two routes. And the said PWM modulation module 100 includes a first resistor R1, a second resistor R2, a third resistor R3, a fourth resistor R4, a first amplifier AMP, a first comparator CMP1, a second comparator CMP2, a first driving circuit and a second driving circuit. The positive input node of the said first amplifier AMP connects to the first input node A for differential audio signals through the first resistor R1, (configured to input the differential audio signals), it also connects to the output node of the first driving circuit through the third resistor R3, and the inverse input node of the first amplifier AMP connects to the second input node B for differential audio signals through the second resistor R2, as well as the output node of the second driving circuit through the fourth resistor R4, the positive output node of the first amplifier AMP connects to the inverse input node of the first comparator CMP1, the negative output node of the first amplifier AMP connects to the inverse input node of the second comparator CMP2, the positive input nodes of both the said first comparator CMP1 and the second comparator CMP2 connect to the output node of the triangle wave module (configured to receive the triangle wave signals), the output node of the first comparator CMP1 connects to the input node of the first driving circuit and the duty ratio detection module 200, the output node of the second comparator CMP2 connects to the input node of the second driving circuit and the duty ratio detection module 200, both the output node of the first driving circuit (i.e., the first output node C of the said class D amplifier chip 10) and the output node of the second driving circuit (i.e., the second output node D of the said class D amplifier chip 10) are the output nodes of the class D amplifier chip 10, and both are connecting to the filter, the control nodes of both the first driving circuit and the second driving circuit are connecting to the output node of the logic control module 300.

The first amplifier AMP of the PWM modulation module 100 amplifies the differential audio signals and outputs inverse shaped sp signals and sn signals. The sp signals and sn signals are compared with the input fixed frequency triangle wave signals through the first comparator CMP1 and the second comparator CMP2 separately, then two routes of PWM signals with complementary duty ratios (low voltage pulses) are output, that is, PWMP signals and PWMN signals (if the duty ratio of PWMP signals is 60%, then that of the PWMN signals is 40%). The first driving circuit and the second driving circuit driving process the PWMP signals and PWMN signals respectively, and generate two routes of according high voltage pulses, which are then filtered by the filter and restored into two groups of according audio signals before sending to the speaker. The duty ratio detection module 200 in the present embodiment is applied to detect the duty ratios of the PWMP signals and the PWMN signals.

In specific implementations, the duty ratio detection module 200 adopts a preset current to charge and discharge the capacitor, and shows the duty ratio of the PWM signals by the ratio of the charging and discharging currents. Thus the said preset maximum duty ratio may be expressed in currents as: Idischarge/(Icharge+Idischarge), wherein, Icharge is the charging current to the capacitor, and Idischarge is the discharging current to the capacitor. Duty ratio detection module 200 converts the high and low electric levels of the PWM signals into the charging and discharging currents to the capacitor, thus detects the duty ratio.

Figure 3:
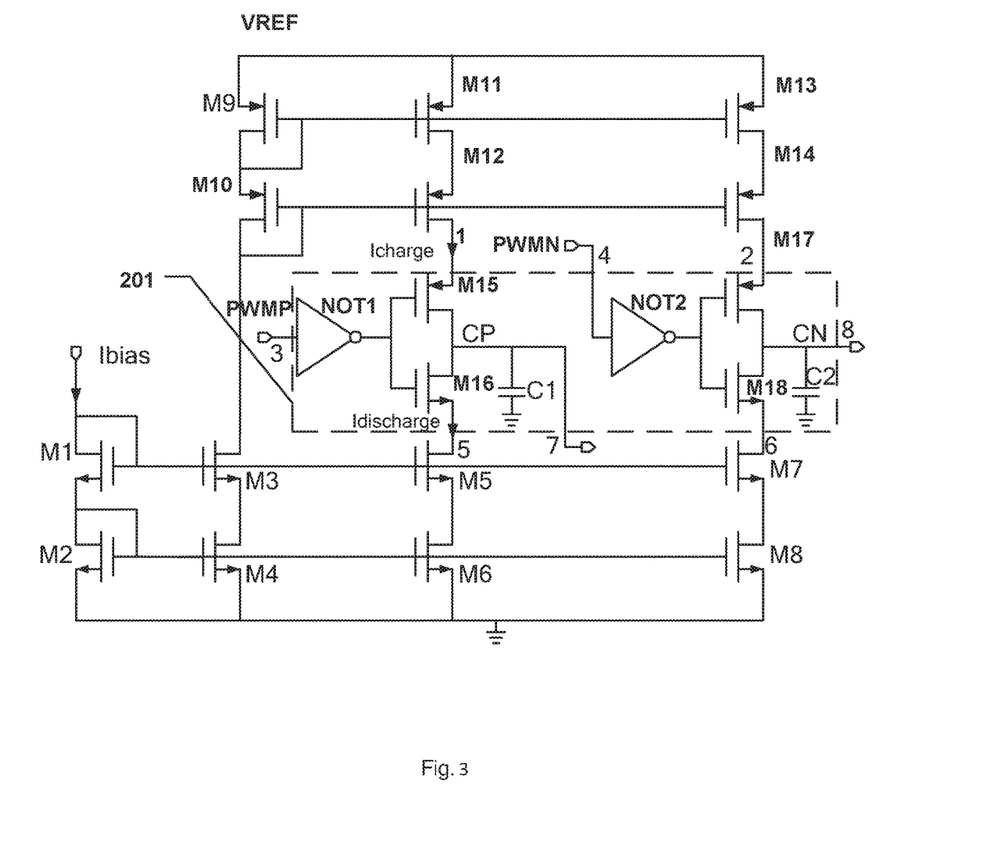
FIG. 3 illustrates a circuit diagram of a duty ratio detection module in the class D amplifier chip with duty ratio limiting functions as provided in an embodiment of the present invention.

Referring to FIG. 3 together, in order to achieve the conversion between the duty ratio and electric currents, the said duty ratio detection module 200 includes a mirror current unit and a charging-discharging control unit 201. The said charging-discharging control unit 201 connects to the mirror current unit, the logic control module, as well as the output nodes of the first comparator CMP1 and the second comparator CMP2 in the PWM modulation module. The mirror current unit adopts a mirror current source technology, following the preset ratio, converts the input bias current Ibias into the charging and discharging currents, then sends to the charging-discharging control unit 201, the charging and discharging control unit 201 then outputs the according charging and discharging commands, following the PWM signals generated by the said PWM modulation module, and converts the charging and discharging currents output from the said mirror current unit into the according values of capacitor voltages and sends to the logic control module 300. The logic control module 300 decides the values of the duty ratio of the PWM signals, comparing to the value of the preset maximum duty ratio, based on the said charging and discharging voltages.

Wherein, the said mirror current unit includes: a first MOS transistor M1, a second MOS transistor M2, a third MOS transistor M3, a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, a Thirteenth MOS transistor M13, a fourteenth MOS transistor M14. The said first MOS transistor M1, second MOS transistor M2, third MOS transistor M3, fourth MOS transistor M4, fifth MOS transistor M5, sixth MOS transistor M6, seventh MOS transistor M7, eighth MOS transistor M8, are all NMOS transistors; while the said ninth MOS transistor M9, tenth MOS transistor M10, eleventh MOS transistor M11, twelfth MOS transistor M12, thirteenth MOS transistor M13, fourteenth MOS transistor M14 are all PMOS transistors.

The gate electrode of the said first MOS transistor M1 connects to the drain electrode of the first MOS transistor M1, the gate electrode of the third MOS transistor M3, the gate electrode of the fifth MOS transistor M5, and the gate electrode of the seventh MOS transistor M7, the source electrode of the first MOS transistor M1 connects to the drain electrode of the second MOS transistor M2, the gate electrode of the second MOS transistor M2, the gate electrode of the fourth MOS transistor M4, the gate electrode of the sixth MOS transistor M6, the gate electrode of the eighth MOS transistor M8, the source electrode of the third MOS transistor M3 connects to the drain electrode of the fourth MOS transistor M4, the source electrode of the fifth MOS transistor M5 connects to the drain electrode of the sixth MOS transistor M6, the source electrode of the seventh MOS transistor M7 connects to the drain electrode of the eighth MOS transistor M8, the source electrode of the third MOS transistor M3 connects to the drain electrode of the fourth MOS transistor M4, the source electrode of the fifth MOS transistor M5 connects to the drain electrode of the sixth MOS transistor M6, the source electrode of the seventh MOS transistor M7 connects to the drain electrode of the eighth MOS transistor M8, while the source electrodes of all the said second, fourth, sixth, eighth MOS transistors (M2, M4, M6, M8) are all getting grounded; the drain electrode of the said third MOS transistor M3 connects to the drain electrode of the tenth MOS transistor M10, the gate electrode of the tenth MOS transistor M10, the gate electrode of the twelfth MOS transistor M12, the gate electrode of the fourteenth MOS transistor M14, the source electrode of the said tenth MOS transistor M10 connects to the drain electrode of the ninth MOS transistor M9, the gate electrode of the ninth MOS transistor M9, the gate electrode of the eleventh MOS transistor M11 and the gate electrode of the thirteenth MOS transistor M13; the source electrode of the twelfth MOS transistor M12 connects to the drain electrode of the eleventh MOS transistor M11, the source electrode of the fourteenth MOS transistor M14 connects to the drain electrode of the thirteenth MOS transistor M13, the source electrodes of the said ninth, eleventh and thirteenth MOS transistors (M9, M11 and M13) are all connecting to the voltage reference node VREF; the drain electrode of the said twelfth MOS transistor M12 connects to the first input node 1 of the charging-discharging control unit 201, the drain electrode of the said fourteenth MOS transistor M14 connects to the second input node 2 of the charging-discharging control unit 201, the drain electrode of the said fifth MOS transistor M5 connects to the first output node 5 of the charging-discharging control unit 201, the drain electrode of the said seventh MOS transistor M7 connects to the second output node 6 of the charging-discharging control unit 201.

A bias current (Ibias) is generated by a bias circuit, which is a present structure and belongs to the prior technology, thus no details will be listed here. The present embodiment adopts a bias current Ibias as the current source for the charging and discharging currents. Following a first preset ratio, through the first MOS transistor M1 and the second MOS transistor M2, the said bias current Ibias is mirrored to the third MOS transistor M3 and the fourth MOS transistor M4, the fifth MOS transistor M5 and the sixth MOS transistor M6, the seventh MOS transistor M7 and the eighth MOS transistor M8. The currents coming from the third MOS transistor M3 and the fourth MOS transistor M4, and passing through the ninth MOS transistor M9 and the tenth MOS transistor M10, are mirrored to the eleventh MOS transistor M11 and the twelfth MOS transistor M12, as well as the thirteenth MOS transistor M13 and the fourteenth MOS transistor M14, following a second preset ratio. The said first preset ratio and the second preset ratio are decided by the width (W) and length (L) of the according MOS transistor, which could be calculated from known formula, and belongs to the prior art, thus will not be described here in details.

Meanwhile, the bias current, Ibias, (owns a certain high voltage) conducts the first MOS transistor M1 up to the eighth MOS transistor M8, these MOS transistors compose a discharging circuit, waiting for the discharging command from the charging and discharging control unit 201. The conduction and grounding of the third MOS transistor M3 and the fourth MOS transistor M4 lowers the electric level of the gate electrode of the tenth MOS transistor M10, therefore conducts the ninth MOS transistor M9, the eleventh MOS transistor M11 up to the fourteenth MOS transistor M14, turns on the voltage reference node VREF, and the MOS transistors from the ninth, M9, up to the fourteenth, M14, compose a charging circuit, waiting for the charging command from the charging and discharging control unit 201.

Wherein, the said charging and discharging control unit 201 includes a first inverter NOT1, a second inverter NOT2, a first capacitor C1, a second capacitor C2, a fifteenth MOS transistor M15, a sixteenth MOS transistor M16, a seventeenth MOS transistor M17 and an eighteenth MOS transistor M18; both the said fifteenth MOS transistor M15 and seventeenth MOS transistor M17 are PMOS transistors, the sixteenth MOS transistor M16 and eighteenth MOS transistor M18 are NMOS transistors, the unit of the capacity values of the first capacitor C1 and the second capacitor C2 is pF.

The input node of the first inverter NOT1 (i.e., the third input node 3 of the charging and discharging control unit 201) connects to the output node of the first comparator CMP1 of the PWM modulation module 100, the output node of the first inverter NOT1 connects to the gate electrodes of the fifteenth MOS transistor M15 and the sixteenth MOS transistor M16, the source electrode of the fifteenth MOS transistor M15 (that is, the first input node 1 of the charging and discharging control unit 201) connects to the drain electrode of the twelfth MOS transistor M12, the source electrode of the sixteenth MOS transistor M16 (i.e., the first output node 5 of the charging and discharging control unit 201) connects to the drain electrode of the fifth MOS transistor M5, one end of the said first capacitor C1 (i.e., the third output node 7 of the charging and discharging control unit 201) connects to the drain electrodes of the fifteenth MOS transistor M15 and the sixteenth MOS transistor M16, the other end of the first capacitor C1 gets grounded.

The input node of the said second inverter NOT2 (that is, the fourth input node 4 of the charging and discharging control unit 201) connects to the output node of the second comparator CMP2 of the PWM modulation module 100, the output node of the second inverter NOT2 connects to the gate electrodes of the seventeenth MOS transistor M17 and the eighteenth MOS transistor M18, the source electrode of the seventeenth MOS transistor M17 (i.e., the second input node 2 of the charging and discharging control unit 201) connects to the drain electrode of the fourteenth MOS transistor M14, the source electrode of the eighteenth MOS transistor M18 (i.e., the second output node 6 of the charging and discharging control unit 201) connects to the drain electrode of the seventh MOS transistor M7, one end of the said second capacitor C2 (that is, the fourth output node 8 of the charging and discharging control unit 201) connects to the drain electrodes of the seventeenth MOS transistor M17 and the eighteenth MOS transistor M18. The other end of the second capacitor C2 gets grounded.

In the present embodiment, the circuit composed by the first inverter NOT1, the first capacitor C1, the fifteenth MOS transistor M15 and the sixteenth MOS transistor M16, expresses the duty ratio of the PWMP signals in the way of charging and discharging currents. The work principles in details are: when the PWMP signal is in a high electric level, the first inverter NOT1 outputs a low electric level and conducts the fifteenth MOS transistor M15 while shuts the sixteenth MOS transistor M16 off, the charging current, Icharge, provided by the eleventh MOS transistor M11 and the twelfth MOS transistor M12 after mirroring the bias current Ibias, passes through the eleventh MOS transistor M11, the twelfth MOS transistor M12 and the fifteenth MOS transistor M15 in the order, and charges the first capacitor C1; in order to enter the charging status, the capacitor voltage CP of the first capacitor C1 rises gradually. When the PWMP signals is in a low electric level, the first inverter NOT1 outputs a high electric level and conducts the sixteenth MOS transistor M16, while shuts off the fifteenth MOS transistor M15. The discharging current, Idischarge, (provided by the fifth MOS transistor M5 and the sixth MOS transistor M6) output from the first capacitor C1, passes through the sixteenth MOS transistor M16, the fifth MOS transistor M5 and the sixth MOS transistor M6 and gets grounded, enters a discharging status, the capacitor voltage CP of the first capacitor C1 drops gradually.

Accordingly, in the present embodiment, the circuit composed by the second inverter NOT2, the second capacitor C2, the seventeenth MOS transistor M17 and the eighteenth MOS transistor M18 expresses the duty ratio of the PWMN signals in the method of charging and discharging currents; the work principle is the same as that of the PWMP signals, it is proper to reference to that of the PWMP described above in specific implementations, and will not be described again here in details.

It should be understood that, if the capacitor voltage CP can rise to the highest voltage (close to the voltage VVREF of the voltage reference source VREF) or not, during the charging process, depends on the ratio of the charging and discharging currents, and the amount of the duty ratio of the PWMP signals. If the charging and discharging currents are equal, as long as the duty ratio is larger than 50%, the first capacitor C1 will keep being charged, up to the highest voltage; if the duty ratio is lower than 50%, the first capacitor C1 will keep being discharged until reaches the lowest voltage.

If the charging and discharging currents are not equal, suppose the charging current is Icharge and the discharging current is Idischarge, the critical point of the detected duty ratio (i.e., the preset maximum duty ratio) is calculated as Idischarge/(Icharge+Idischarge). When the capacitor voltage CP of the first capacitor C1 and the capacitor voltage CN of the second capacitor C2 are outputting to the logic control module, usually, only when the discharging current is greater than the charging current, can a duty ratio over 50% be detected; otherwise, if the discharging current is smaller than the charging current, only a duty ratio smaller than 50%% can be detected, in such a case, the class D amplifier chip 10 will keep having no output. That is due to the complementation between the duty ratio of the PWMP signal and the PWMN signal, so there is always one duty ratio, among these two signals, larger than 50%, resulting in triggering the logic control module 300 output an enable signal EN. It is possible to adjust the maximum duty ratio for detection through adjusting the ratio of the charging and discharging currents.

Figure 4:
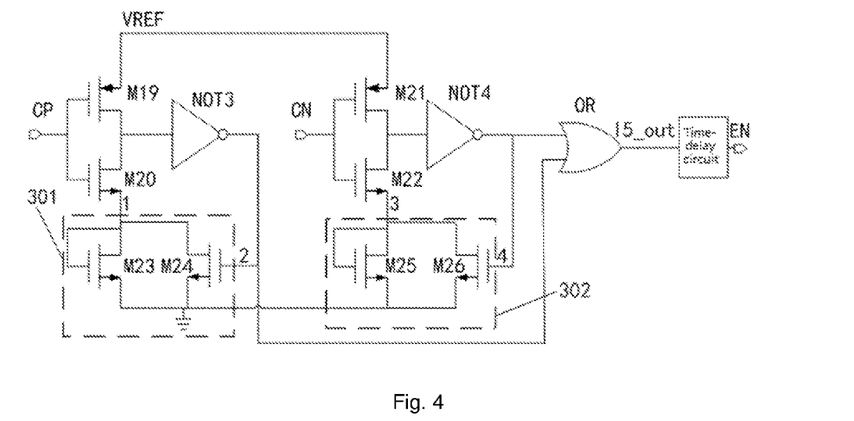
FIG. 4 illustrates a schematic diagram for the logic control module in the class D amplifier chip with duty ratio limiting functions as provided in an embodiment of the present invention.

The capacitor voltage CP of the first capacitor C1 and the capacitor voltage CN of the second capacitor C2 are input into the logic control module 300 for further judgments. Referring to FIG. 4 together, the said logic control module 300 includes: a first anti-jamming circuit 301, a second anti-jamming circuit 302, a third inverter NOT3, a fourth inverter NOT4, an OR gate OR, a nineteenth MOS transistor M19, a twentieth MOS transistor M20, a twenty-first MOS transistor M21 and a twenty-second MOS transistor M22. Both the said nineteenth MOS transistor M19 and twenty-first MOS transistor M21 are PMOS transistors, both the twentieth MOS transistor M20 and the twenty-second MOS transistor M22 are NMOS transistors.

The gate electrode of the said nineteenth MOS transistor M19 connects to the gate electrode of the twentieth MOS transistor M20 and one end of the first capacitor C1 in the charging and discharging control unit 201, the drain electrode of the nineteenth MOS transistor M19 connects to the drain electrode of the twentieth MOS transistor M20 and the input node of the third inverter NOT3, the source electrode of the twentieth MOS transistor M20 connects to the input node 1 of the first anti-jamming circuit 301, the output node of the said third inverter NOT3 connects to the control node 2 of the first anti-jamming circuit 301 and the first input node of the OR gate OR.

The gate electrode of the said twenty-first MOS transistor M21 connects to the gate electrode of the twenty-second MOS transistor M22 and one end of the second capacitor C2 in the charging and discharging control unit 201, the drain electrode of the twenty-first MOS transistor M21 connects to the drain electrode of the twenty-second MOS transistor M22 and the input node of the fourth inverter NOT4, the source electrode of the twenty-second MOS transistor M22 connects to the input node 3 of the second anti-jamming circuit 302, the output node of the fourth inverter NOT4 connects to the control node 4 of the second anti-jamming circuit 302 and the second input node of the OR gate OR.

Both the said source electrodes of the nineteenth MOS transistor M19 and the twenty-first MOS transistor M21 connect to the voltage referencing source node VREF, the output node of the said OR gate OR connects to the control node of the first driving circuit, the control node of the second driving circuit, the control node of the first comparator, CMP1, the control node of the second comparator, CMP2, and the control node of the first amplifier AMP, in the PWM modulation module.

In the present embodiment, the reverse voltage of the twentieth MOS transistor M20 and the twenty-second MOS transistor M22 is set to be VVREF/2. When the capacitor voltage CP of the first capacitor C1 or the capacitor voltage CN of the second capacitor C2 is in a high electrical level and greater than VVREF/2, either the twentieth MOS transistor M20 or the twenty-second MOS transistor M22 will be conducted, and finally outputs an enable signal EN in a high electric level, therefore, shuts off the first driving circuit, the second driving circuit, the first comparator CMP1, the second comparator CMP2 and the first amplifier AMP, then stops the output of audio signals with relatively large amplitude, avoids burning the speaker off.

Wherein, the said first anti-jamming circuit 301 includes a twenty-third MOS transistor M23 and a twenty-fourth MOS transistor M24; the drain electrode of the said twenty-third MOS transistor M23 (i.e., the input node 1 of the first anti-jamming circuit 301) connects to the gate electrode of the twenty-third MOS transistor M23, the source electrode of the twentieth MOS transistor M20 and the drain electrode of the twenty-fourth MOS transistor M24, the gate electrode of the said twenty-fourth MOS transistor M24 (i.e., the control node 2 of the first anti-jamming circuit 301) connects to the output node of the third inverter NOT3, both source electrodes of the said twenty-third MOS transistor M23 and the twenty-fourth MOS transistor M24 are getting grounded.

Accordingly, the said second anti-jamming circuit 302 includes a twenty-fifth MOS transistor M25 and a twenty-sixth MOS transistor M26; the drain electrode of the said twenty-fifth MOS transistor M25 (i.e., the input node 3 of the second anti-jamming circuit 302) connects to the gate electrode of the twenty-fifth MOS transistor M25, the source electrode of the twenty-second MOS transistor M22 and the drain electrode of the twenty-sixth MOS transistor M26, the gate electrode of the said twenty-sixth MOS transistor M26 (i.e., the control node 4 of the second anti-jamming circuit 302) connects to the output node of the fourth inverter NOT4, both source electrodes of the said twenty-fifth MOS transistor M25 and the twenty-sixth MOS transistor M26 are getting grounded.

In the present embodiment, when the capacitor voltage CP of the first capacitor C1 is in a low electric level, the nineteenth MOS transistor M19 gets conducted and outputs a high electric level, which passes through the third inverter NOT3 and gets inversed, then output to the OR gate OR, as a low electric level; now the output results of the OR gate OR are decided by the output of the fourth inverter NOT4. When either of the input to the OR gate OR is in a high electric level, it outputs a high electric level; only when both input are in a low electric level, will it output a low electric level.

When the capacitor voltage CP of the first capacitor C1 is in a high electric level and larger than VVREF/2, the twentieth MOS transistor M20 gets conducted. Due to the gate electrode of the twenty-third MOS transistor M23 connecting to its drain electrode, the twenty third MOS transistor M23 is equivalent to a diode (with a voltage drop of 0.7V), whose anode connects to the source electrode of the twentieth MOS transistor M20, and the cathode gets grounded. Thus, when the twentieth MOS transistor M20 gets conducted, the diode (i.e., the twenty third MOS transistor M23) also gets conducted, and lowers the input node of the third inverter NOT3, then the third inverter NOT3 outputs a high electric level to the OR gate OR, and the OR gate OR outputs a high electric level. At the same while, the third inverter NOT3 outputs a high electric level and controls the twenty-fourth MOS transistor M24 conduct, which makes the twenty-third MOS transistor M23 short-circuit, as long as the capacitor voltage CP is keeping in a high electric level, the third inverter NOT3 is then ensured to keep outputting a high electric level, which effectively solves the problem of wave form shaking of the capacitor voltage CP, or unstable output due to the appearing of interference burrs.

The work principle of the said second anti-jamming circuit 302 is the same as that of the first anti-jamming circuit 301, thus will not be described here again.

In order to reduce any mistaken judgments, a time-delay circuit could be further added after the OR gate OR, that is, the output node of the said OR gate OR connects to the input node of the time-delay circuit, and whose output node connects to the control nodes of the first driving circuit, the second driving circuit, the first comparator CMP1, the second comparator CMP2 and the first amplifier AMP;

which makes the enable signals EN in the high electric level delay for 100 ms before outputting. The said time-delay circuit belongs to the current technology, has multiple realization methods, as long as it can make the enable signals EN in high electric levels delay for a certain time before outputting, thus its detailed circuit structure will not be restricted here.

Figure 5:
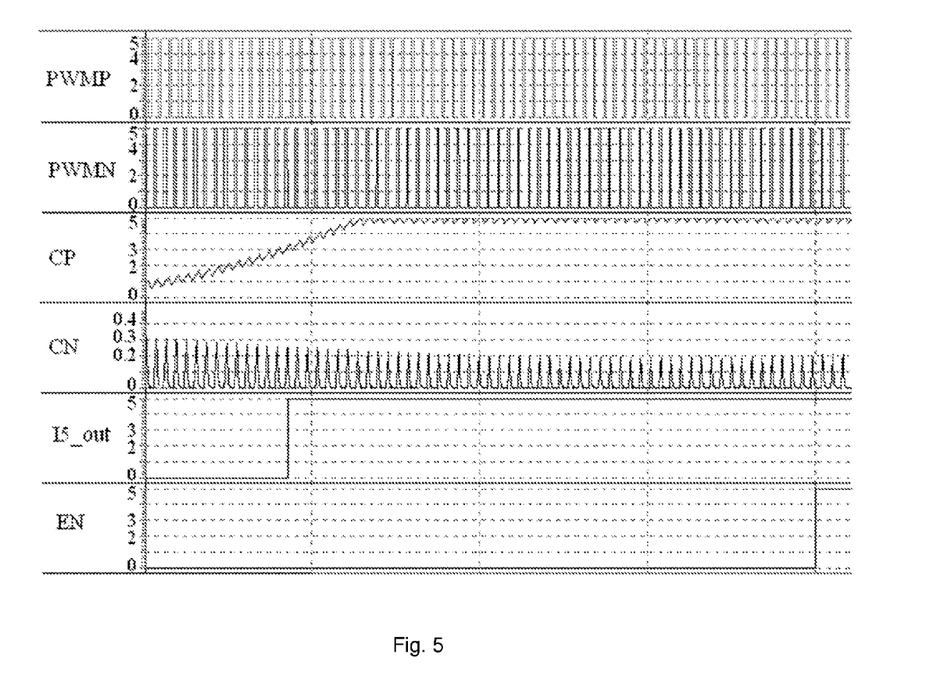
FIG. 5 illustrates a waveform diagram for the class D amplifier chip with duty ratio limiting functions as provided in an embodiment of the present invention.

Referring to FIG. 5 together, it can be seen after waveform simulating to the above said class D amplifier chip, supposing the duty ratio of the PWMP signals is 70%. The high electric level of the PWMP signals is kept for a relatively long time, thus the charging time to the first capacitor C1 (that is, the high electric level time of the PWMP signals) is longer than the discharging time (that is, the low electric level time of the PWMP signals); in the present embodiment, the Idischarge/Icharge=2, which means, the preset maximum duty ratio for detection is 66.7%. Thus, when a PWMP signal with a duty ratio of 70% is input, the maximum voltage that the value of the capacitor voltage CP can finally reach is VVREF. Since the duty ratio of the PWMN signals adding that of the PWMP signals equals to 100%, thus, the duty ratio of the PWMN signals is 30%. The final value of the capacitor voltage CN is zero. Input the capacitor voltage CP and the capacitor voltage CN into the logic control modules, then output the I5_out signal, after some time delay, the electric level of the I5_out signal changes from low to high, thus, output the enable signal EN which is high electric level, therefore, shuts down the output of high voltage pulses, and protects the speaker.

Additionally, when the amplitude of the differential audio signals is overlarge, the capacitors for input (i.e., the two capacitors connecting right after the differential audio signals entrance in FIG. 2) could be short circuited to the ground. Since the said class D amplifier device with duty ratio limiting functions is possible to shut down the output of the class D amplifier chips, and protect the speaker, when the amplitude of the differential audio signals is over large. Therefore, when the capacitors for input is short circuited to the ground, the output of the class D amplifier chip can also be shut down, thus the said class D amplifier device can also detect the abnormal situations of short circuited capacitors for input.

In summary, the class D amplifier chips with duty ratio limiting functions, as provided in the present invention, and the device thereof, based on the principle that the output amplitude of the audio signals is proportional to the duty ratio of the PWM signals, when deciding that the duty ratio of the PWM signals is larger than the preset maximum duty ratio, by real-time detecting the duty ratio of the PWM signals, the PWM modulation module stops working, and the high voltage pulses output from the class D amplifier chips is shut down, thus the audio output from the class D amplifier device is also shut down; while limiting the output with overlarge duty ratio equals to limiting the output of audio signals with overlarge amplitudes, thus avoids burning the speaker by audio signals with overlarge amplitudes. When the duty ratio of the PWM signals is smaller than the preset maximum duty ratio, the audio output of the class D amplifier device is turned on or kept, which ensures the class D amplifier device work normally.

Additionally, the said class D amplifier device can also detect some abnormal situations, such as: the capacitor for input is short circuited to the ground.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

The invention claimed is:

1. A class D amplifier chip with duty ratio limiting functions, comprising:
    a triangle wave module, configured to generate triangle wave signals,
    a PWM modulation module, configured to convert a plurality of input differential audio signals and the triangle wave signals generated by the triangle wave module into low voltage pulsed PWM signals, and drive the PWM signals to generate high voltage pulses;
    a duty ratio detection module, configured to detect in real-time a duty ratio of the PWM signals generated by the PWM modulation module;
    a logic control module, configured to immediately shut off the PWM modulation module if the duty ratio of the PWM signals is larger than a preset maximum value for the duty ratio;
    wherein the PWM modulation module comprises a first resistor, a second resistor, a third resistor, a fourth resistor, a first amplifier, a first comparator, a second comparator, a first driving circuit and a second driving circuit;
    wherein a positive input node of the first amplifier connects to a first input node for differential audio signals through the first resistor, and also connects to an output node of the first driving circuit through the third resistor, and an inverse input node of the first amplifier connects to a second input node for the differential audio signals through the second resistor, and also connects to the output node of the second driving circuit through the fourth resistor,
    wherein a positive output node of the first amplifier connects to an inverse input node of the first comparator, a negative output node of the first amplifier connects to an inverse input node of the second comparator,
    wherein a plurality of positive input nodes of both the first comparator and the second comparator connect to an output node of the triangle wave module, an output node of the first comparator connects to an input node of the first driving circuit and to the duty ratio detection module,
    wherein an output node of the second comparator connects to an input node of the second driving circuit and to the duty ratio detection module,
    wherein both the output nodes of the first driving circuit and the second driving circuit are the output node of the class D amplifier, and both the control nodes of the first driving circuit and the second driving circuit connect to the logic control module.

2. The class D amplifier chip with duty ratio limiting functions according to claim 1, wherein the logic control module comprises: a first anti-jamming circuit, a second anti-jamming circuit, a third inverter, a fourth inverter, an OR gate, a nineteenth MOS transistor, a twentieth MOS transistor, a twenty first MOS transistor and a twenty second MOS transistor;
    wherein a gate electrode of the nineteenth MOS transistor connects to a gate electrode of the twentieth MOS transistor and to a charging-discharging control unit,
    wherein a drain electrode of the nineteenth MOS transistor connects to a drain electrode of the twentieth MOS transistor and to an input node of the third inverter, wherein a source electrode of the twentieth MOS transistor connects to an input node of the first anti-jamming circuit, wherein the output node of the third inverter connects to a control node of the first anti-jamming circuit and to a first input node of the OR gate;

wherein a gate electrode of the twenty first MOS transistor connects to a gate electrode of the twenty second MOS transistor and to the charging-discharging control unit, wherein a drain electrode of the twenty first MOS transistor connects to a drain electrode of the twenty second MOS transistor and to the input node of the fourth inverter, wherein a source electrode of the twenty second MOS transistor connects to an input node of the second anti-jamming circuit, wherein an output node of the fourth inverter connects to a control node of the second anti-jamming circuit and to the second input node of the OR gate;

wherein a plurality of source electrodes of the nineteenth and of the twenty-first MOS transistors connect to a voltage reference node, and wherein an output node of the OR gate connects to the PWM modulation module.

3. The class D amplifier chip with duty ratio limiting functions according to claim 2, wherein the first anti-jamming circuit comprises: a twenty-third MOS transistor and a twenty-fourth MOS transistor, wherein a drain electrode of the twenty-third MOS transistor connects to a gate electrode of the twenty-third MOS transistor, wherein the source electrode of the twentieth MOS transistor connects to a drain electrode of the twenty-fourth MOS transistor, wherein a gate electrode of the twenty-fourth MOS transistor connects to an output node of the third inverter, and wherein a source electrode of the twenty-third MOS transistor and a source electrode of the twenty-fourth MOS transistors are both getting grounded.

4. The class D amplifier chip with duty ratio limiting functions according to claim 2, wherein the second anti-jamming circuit comprises: a twenty-fifth MOS transistor and a twenty-sixth MOS transistor, wherein a drain electrode of the twenty-fifth MOS transistor connects to a gate electrode of the twenty-fifth MOS transistor, wherein a source electrode of the twenty-second MOS transistor and a drain electrode of the twenty-sixth MOS transistor, wherein a gate electrode of the twenty-sixth MOS transistor connects to an output node of the fourth inverter, and wherein a source electrode of the twenty-fifth MOS transistor and a source electrode of the twenty-sixth MOS transistor are both getting grounded.

5. The class D amplifier chip with duty ratio limiting functions according to claim 1, wherein the duty ratio detection module comprises:

a mirror current unit, configured to convert an input bias current into a charging current and discharging current, which charging current and discharging current is output to the charging-discharging control unit in a preset ratio; and a charging-discharging control unit, configured to convert the charging and discharging currents output from the mirror current unit into the corresponding capacitor voltages, and then to send the capacitor voltages to the logic control module, wherein the output of the charging-discharging control unit corresponds to the PWM signals generated by the PWM modulation module.

6. The class D amplifier device with duty ratio limiting functions according to claim 5, wherein the mirror current unit comprises: a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor;

and wherein a gate electrode of the first MOS transistor connects to a drain electrode of the first MOS transistor, a gate electrode of the third MOS transistor, a gate electrode of the fifth MOS transistor, and a gate electrode of the seventh MOS transistor, wherein a source electrode of the first MOS transistor connects to a drain electrode of the second MOS transistor, a gate electrode of the second MOS transistor, a gate electrode of the fourth MOS transistor, a gate electrode of the sixth MOS transistor, and a gate electrode of the eighth MOS transistor, wherein a source electrode of the third MOS transistor connects to a drain electrode of the fourth MOS transistor, wherein a source electrode of the fifth MOS transistor connects to a drain electrode of the sixth MOS transistor, wherein a source electrode of the seventh MOS transistor connects to a drain electrode of the eighth MOS transistor, wherein a source electrode of each of the second, fourth, sixth, and eighth MOS transistor is getting grounded, wherein a drain electrode of the third MOS transistor connects to a drain electrode of the tenth MOS transistor, a gate electrode of the tenth MOS transistor, a gate electrode of the twelfth MOS transistor, and a gate electrode of the fourteenth MOS transistor, wherein a source electrode of the tenth MOS transistor connects to a drain electrode of the ninth MOS transistor, a gate electrode of the ninth electrode, a gate electrode of the ninth MOS transistor, a gate electrode of the eleventh MOS transistor, and a gate electrode of the thirteenth MOS transistor, wherein a source electrode of the twelfth MOS transistor connects to a drain electrode of the eleventh MOS transistor, wherein a source electrode of the fourteenth MOS transistor connects to a drain electrode of the thirteenth MOS transistor, wherein a source electrode of each of the ninth, eleventh and the thirteenth MOS transistor connect to a voltage reference node, wherein a drain electrode of the twelfth MOS transistor connects to a first input node of the charging-discharging control unit, wherein a drain electrode of the fourteenth MOS transistor connects to a second input node of the charging-discharging control unit, wherein a drain electrode of the fifth MOS transistor connects to a first output node of the charging-discharging control unit, and wherein a drain electrode of the seventh MOS transistor connects to a second output node of the charging-discharging control unit.

7. The class D amplifier chip with duty ratio limiting functions according to claim 5, wherein the first MOS transistor, second MOS transistor, third MOS transistor, fourth MOS transistor, fifth MOS transistor, sixth MOS transistor, seventh MOS transistor, and eighth MOS transistor each is a NMOS type transistor, and wherein the ninth MOS transistor, tenth MOS transistor, eleventh MOS transistor, twelfth MOS transistor, thirteenth MOS transistor and fourteenth MOS transistor each is a PMOS type transistor.

8. The class D amplifier chip with duty ratio limiting functions according to claim 5, wherein the charging-discharging control unit comprises: a first inverter, a second inverter, a first capacitor, a second capacitor, a fifteenth MOS transistor, a sixteenth MOS transistor, a seventeenth MOS transistor, an eighteenth MOS transistor;

wherein an input node of the first inverter connects to the PWM modulation module, wherein an output node of the first inverter connects to a gate electrode of the fifteenth MOS transistor and a gate electrode of the sixteenth MOS transistor, wherein a source electrode of the fifteenth MOS transistor connects to a drain electrode of the twelfth MOS transistor, wherein a source electrode of the sixteenth MOS transistor connects to a drain electrode of the fifth MOS transistor, wherein one end of a first capacitor connects to a drain electrode of the fifteenth MOS transistor and a drain electrode of the sixteenth MOS transistor, and the other end of the first capacitor gets grounded, wherein an input node of the second inverter connects to the PWM modulation module, wherein an output node of the second inverter connects to a gate electrode of the seventeenth MOS transistor and the eighteenth MOS transistor, wherein a source electrode of the seventeenth MOS transistor connects to a drain electrode of the fourteenth MOS transistor, wherein a source electrode of the eighteenth MOS transistor connects to a drain electrode of the seventh MOS transistor, wherein one end of the second capacitor connects to a drain electrode of the seventeenth MOS transistor and a drain electrode of the eighteenth MOS transistor, and the other end of the second capacitor gets grounded.

9. The class D amplifier chip with duty ratio limiting functions according to claim 5, wherein the logic control module comprises: a first anti-jamming circuit, a second anti-jamming circuit, a third inverter, a fourth inverter, an OR gate, a nineteenth MOS transistor, a twentieth MOS transistor, a twenty first MOS transistor and a twenty second MOS transistor;

wherein a gate electrode of the nineteenth MOS transistor connects to a gate electrode of the twentieth MOS transistor and the charging-discharging control unit, wherein a drain electrode of the nineteenth MOS transistor connects to a drain electrode of the twentieth MOS transistor and an input node of the third inverter, wherein a source electrode of the twentieth MOS transistor connects to an input node of the first anti-jamming circuit, wherein an output node of the third inverter connects to a control node of the first anti-jamming circuit and a first input node of the OR gate;

wherein a gate electrode of the twenty first MOS transistor connects to a gate electrode of the twenty second MOS transistor and the charging-discharging control unit, wherein a drain electrode of the twenty first MOS transistor connects to a drain electrode of the twenty second MOS transistor and an input node of the fourth inverter, wherein a source electrode of the twenty second MOS transistor connects to an input node of the second anti-jamming circuit, wherein an output node of the fourth inverter connects to a control node of the second anti-jamming circuit and a second input node of the OR gate;

wherein a source electrodes of the nineteenth MOS transistor and the twenty-first MOS transistor connect to the voltage reference node, and wherein an output node of the OR gate connects to the PWM modulation module.

10. The class D amplifier chip with duty ratio limiting functions according to claim 9, wherein the first anti-jamming circuit comprises a twenty-third MOS transistor and a twenty-fourth MOS transistor, wherein a drain electrode of the twenty-third MOS transistor connects to a gate electrode of the twenty-third MOS transistor, wherein a source electrode of the twentieth MOS transistor connects to a drain electrode of the twenty-fourth MOS transistor, wherein a gate electrode of the twenty-fourth MOS transistor connects to an output node of the third inverter, and wherein a source electrode of the twenty-third MOS transistor and a source electrode of the twenty-fourth MOS transistor are both getting grounded.

11. The class D amplifier chip with duty ratio limiting functions according to claim 9, wherein the second anti-jamming circuit comprises a twenty-fifth MOS transistor and a twenty-sixth MOS transistor, wherein a drain electrode of the twenty-fifth MOS transistor connects to a gate electrode of the twenty-fifth MOS transistor, wherein a source electrode of the twenty-second MOS transistor and a drain electrode of the twenty-sixth MOS transistor, wherein a gate electrode of the twenty-sixth MOS transistor connects to an output node of the fourth inverter, and wherein a source electrode of the twenty-fifth MOS transistor and a source electrode of the twenty-sixth MOS transistor are both getting grounded.

12. A class D amplifier device with duty ratio limiting functions, comprising: a filter, a speaker and a class D amplifier chip with duty ratio limiting functions, wherein the class D amplifier chip comprises:

a triangle wave module, configured to generate triangle wave signals, a PWM modulation module, configured to convert a plurality of input differential audio signals and the triangle wave signals generated by the triangle wave module into low voltage pulsed PWM signals, and drive the PWM signals to generate high voltage pulses output;

a duty ratio detection module, configured to detect in real-time a duty ratio of the PWM signals generated by the PWM modulation module;

a logic control module, configured to immediately shut off the PWM modulation module if the duty ratio of the PWM signals is larger than a preset maximum value, wherein the PWM modulation module comprises a first resistor, a second resistor, a third resistor, a fourth resistor, a first amplifier, a first comparator, a second comparator, a first driving circuit and a second driving circuit;

wherein a positive input node of the first amplifier connects to a first input node for differential audio signals through the first resistor, and also connects to an output node of the first driving circuit through the third resistor, and an inverse input node of the first amplifier connects to a second input node for the differential audio signals through the second resistor, and also connects to the output node of the second driving circuit through the fourth resistor, wherein a positive output node of the first amplifier connects to an inverse input node of the first comparator, a negative output node of the first amplifier connects to an inverse input node of the second comparator, wherein a plurality of positive input nodes of both the first comparator and the second comparator connect to an output node of the triangle wave module, an output node of the first comparator connects to an input node of the first driving circuit and to the duty ratio detection module, wherein an output node of the second comparator connects to an input node of the second driving circuit and to the duty ratio detection module, wherein both the output nodes of the first driving circuit and the second driving circuit are the output node of the class D amplifier, and both the control nodes of the first driving circuit and the second driving circuit connect to the logic control module, and wherein the class D amplifier chip connects to the speaker through the filter, and the high voltage pulses output from the class D amplifier chip is restored into audio signals after being filtered by the filter and before an output to the speaker is generated causing it to vibrate and provide audio.

* * * * *